US012677391B2

(12) United States Patent
Chou et al.

(10) Patent No.: US 12,677,391 B2
(45) Date of Patent: Jul. 7, 2026

(54) EXTERNAL BUTTON CONTROL SYSTEM

(71) Applicant: Quanta Computer Inc., Taoyuan City (TW)

(72) Inventors: Le-Sheng Chou, Taoyuan City (TW); Shuen-Hung Wang, Taoyuan City (TW); Sz-Chin Shih, Taoyuan City (TW); Geng-Hao Chang, Taoyuan City (TW)

(73) Assignee: Quanta Computer Inc., Taoyuan City (TW)

( * ) Notice: Subject to any disclaimer, the term of this patent is extended or adjusted under 35 U.S.C. 154(b) by 129 days.

(21) Appl. No.: 18/673,041

(22) Filed: May 23, 2024

(65) Prior Publication Data

US 2025/0365881 A1      Nov. 27, 2025

(51) Int. Cl.
B60K 20/06      (2006.01)
F16H 37/14      (2006.01)
H05K 7/14      (2006.01)

(52) U.S. Cl.
CPC ........... H05K 7/1489 (2013.01); F16H 37/14 (2013.01)

(58) Field of Classification Search
CPC ............................ H05K 7/1489; G05B 19/042
See application file for complete search history.

(56) References Cited

U.S. PATENT DOCUMENTS

2007/0157385 A1 * 7/2007 Lemire ................ A61G 7/0524
                                                                          5/618
2022/0266451 A1    8/2022 Cristache
2022/0390927 A1    12/2022 Yamashita et al.

FOREIGN PATENT DOCUMENTS

CN      114730175 A      7/2022
TW      201916095 A      4/2019
TW      202349554 A      12/2023

OTHER PUBLICATIONS

TW Office Action for Application No. 113131091 mailed Feb. 20, 2025, w/ First Office Action Summary, 6 pp.
TW Search Report for Application No. 113131091 mailed Feb. 20, 2025, w/ First Office Action, 1 p.

* cited by examiner

*Primary Examiner* — Muhammad S Islam
(74) *Attorney, Agent, or Firm* — Nixon Peabody LLP

(57)      ABSTRACT

A control system for a computing device includes a control device configured to be communicatively coupled to an external network; a first actuator coupled to the control device, the first actuator being electronically operable by the control device in response to commands received by the control device via the external network; a second actuator manually operable by a local user; and a linkage system coupled to the first actuator and the second actuator. Both the first actuator and the second actuator are operable to move the linkage system from a first position to a second position to physically engage an external interface of the computing device.

15 Claims, 5 Drawing Sheets

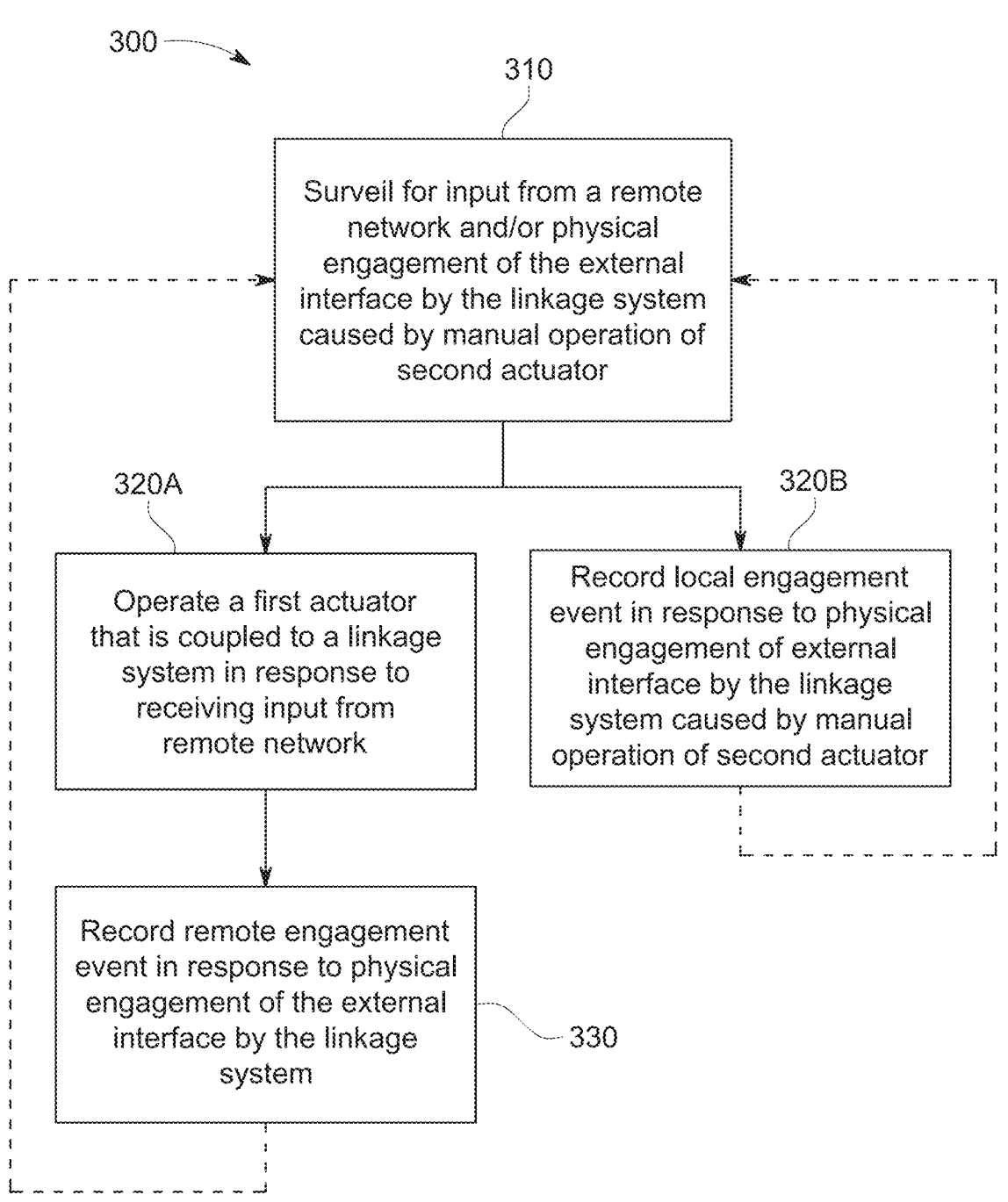

300

310

Surveil for input from a remote network and/or physical engagement of the external interface by the linkage system caused by manual operation of second actuator

320A

Operate a first actuator that is coupled to a linkage system in response to receiving input from remote network

320B

Record local engagement event in response to physical engagement of external interface by the linkage system caused by manual operation of second actuator Record remote engagement event in response to physical engagement of the external interface by the linkage system

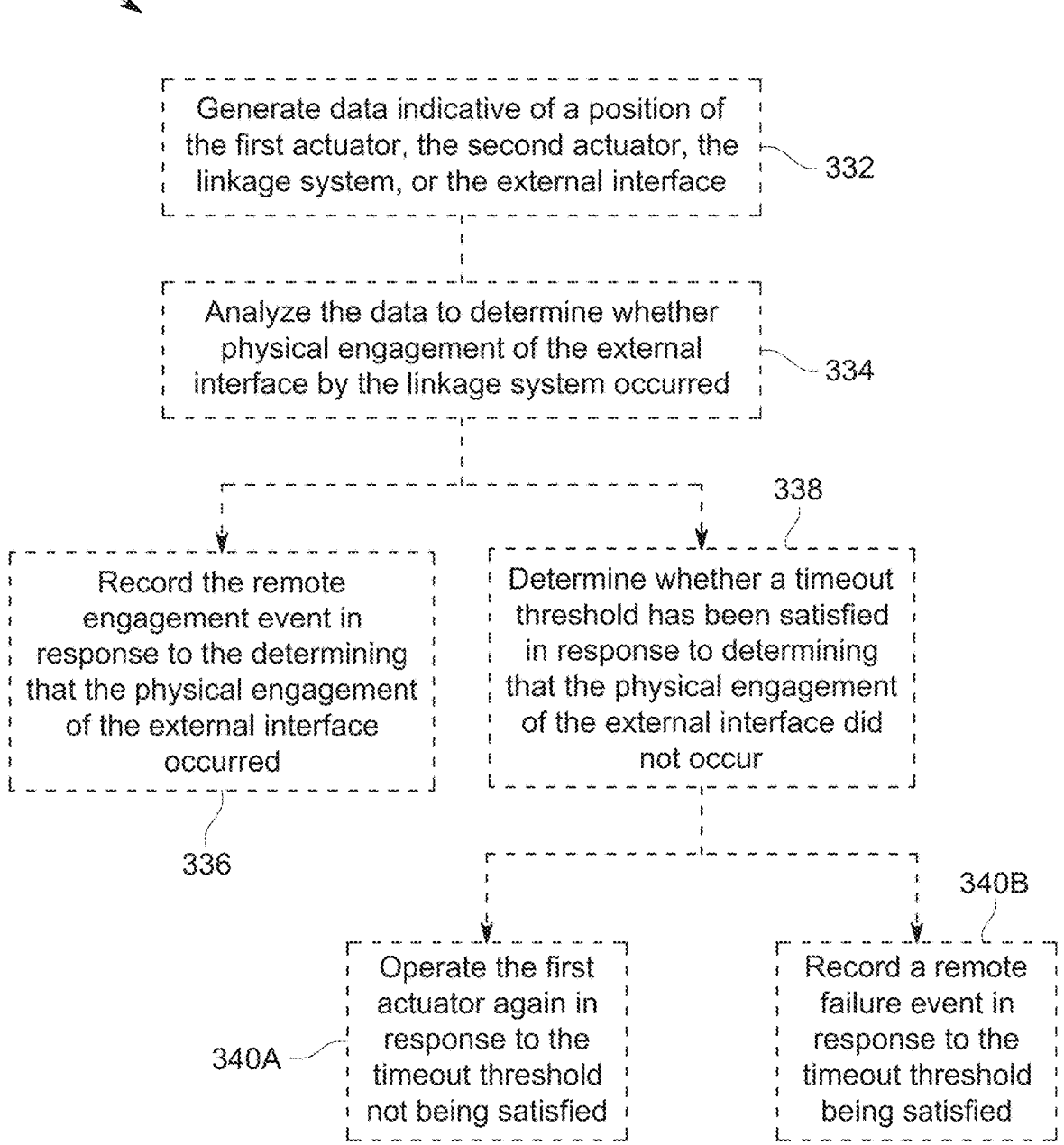

Generate data indicative of a position of the first actuator, the second actuator, the linkage system, or the external interface — 332

Analyze the data to determine whether physical engagement of the external interface by the linkage system occurred — 334

338

Record the remote engagement event in response to the determining that the physical engagement of the external interface occurred Determine whether a timeout threshold has been satisfied in response to determining that the physical engagement of the external interface did not occur

336

Operate the first actuator again in response to the timeout threshold not being satisfied — 340A Record a remote failure event in response to the timeout threshold being satisfied — 340B

FIG. 3B

EXTERNAL BUTTON CONTROL SYSTEM

FIELD OF THE INVENTION

The present disclosure relates generally to systems and methods for physically engaging an external interface of a local computing device, and more specifically, to systems and methods for physically engaging an external interface of a local computing device using a remotely-operated actuator and a locally-operated actuator.

BACKGROUND OF THE INVENTION

Servers and other similar computing devices are often used in data centers (and in other locations) for cloud computing and other applications. A basic feature of such servers is the ability to remotely control the operations of the server, such as power-on/power-off, reset, ejection of physical media, etc. Due to increased demand for these servers, computing devices that were not designed as remote servers are often used as "outsourced" remote servers. However, many of these computing devices have external interfaces (e.g., buttons) that are designed to be manually operated by a local user and cannot be operated remotely, which makes use of these computing devices as remote servers difficult. Thus, new systems and methods are needed for physically engaging the external interface of such computing devices.

SUMMARY OF THE INVENTION

The term embodiment and like terms, e.g., implementation, configuration, aspect, example, and option, are intended to refer broadly to all the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

In a first implementation, the present disclosure is directed to a control system for a computing device. The control system includes a control device, a first actuator, a second actuator, and a linkage system. The control device is configured to be communicatively coupled to an external network. The first actuator is coupled to the control device and is electronically operable by the control device in response to commands received by the control device via the external network. The second actuator is manually operable by a local user. The linkage system is coupled to the first actuator and the second actuator. Both the first actuator and the second actuator are operable to move the linkage system from a first position to a second position to physically engage an external interface of the computing device.

In some aspects of the first implementation, the linkage system includes a bracket configured to move linearly, and a rotatable arm positioned adjacent to the bracket and configured to rotate relative to the bracket.

In some aspects of the first implementation, the first actuator and the second actuator are operable to impart force on the bracket such that the bracket moves linearly toward the rotatable arm. The linear movement of the bracket causes the rotatable arm to rotate toward and physically engage the external interface of the computing device.

In some aspects of the first implementation, the external interface of the computing device is a button, and the rotatable arm is configured to press the button in response to the first actuator or the second actuator moving the linkage system from the first position to the second position.

In some aspects of the first implementation, the first actuator is an electric motor having a rotatable shaft coupled to a cam. In response to the control device operating the motor, the cam rotates against the bracket to cause the bracket to move linearly. The linear movement of the bracket causes the rotatable arm to rotate.

In some aspects of the first implementation, the second actuator is a button. In response to the user pressing the button, the button presses against the bracket to cause the bracket to move linearly. The linear movement of the bracket causes the rotatable arm to rotate.

In some aspects of the first implementation, the linkage system is biased toward the first position. In response to the first actuator or the second actuator no longer imparting force on the bracket, the bracket moves linearly away from the rotatable arm. This linear movement of the bracket causes (i) rotation of the rotatable arm away from the external interface and (ii) physical disengagement of the external interface.

In some aspects of the first implementation, the control system further includes a sensor unit communicatively coupled to the control device. The sensor unit is configured to generate data associated with a position of the first actuator, a position of the second actuator, a position of the linkage system, a position of the external interface of the computing device, or any combination thereof. The sensor unit is further configured to transmit the data to the control device.

In some aspects of the first implementation, the control device is a microcontroller.

In some aspects of the first implementation, the first actuator is an electric motor.

In some aspects of the first implementation, the electric motor is a stepper motor or a servomotor.

In some aspects of the first implementation, the second actuator is a button.

In a second implementation, the present disclosure is directed to a computing system that includes a housing, a computing device having an external interface, a control device, a first actuator, a second actuator, and a linkage system. The computing device is positioned within the housing. The control device is positioned within the housing and is configured to be communicatively coupled to an external network. The first actuator is positioned within the housing and coupled to the control device. The first actuator is electronically operable by the control device in response to commands received by the control device via the external network. The second actuator is positioned partially within the housing and is accessible externally from the housing. The second actuator is manually operable by a local user. The linkage system is positioned within the housing and is coupled to the first actuator and the second actuator. Both the first actuator and the second actuator are operable to move the linkage system from a first position to a second position to physically engage the external interface.

In some aspects of the second implementation, the external interface of the computing device includes a button, a lever, a switch, a dial, a knob, or any combination of thereof.

In some aspects of the second implementation, physically engaging the external interface of the computing device powers on the computing device, powers off the computing device, resets the computing device, or ejects an insertable component from the computing device.

In a third implementation, the present disclosure is directed to a method for operating a computing system that includes a computing device with an external interface, a linkage system configured to physically engage the external interface, a first actuator coupled to the linkage system, and a second actuator coupled to the linkage system. The method includes, in response to receiving a remote input from an external network, operating the first actuator. The method further includes, in response to the operating of the first actuator, determining whether a first physical engagement of the external interface by the linkage system occurred. The method further includes, in response to determining that the first physical engagement of the external interface occurred, recording a remote engagement event in a log of the computing system. The method further includes determining whether a second physical engagement of the external interface caused by manual operation of the second actuator by a local user occurred. The method further includes, in response to determining that the second physical engagement occurred, recording a local engagement event in the log of the computing system.

In some aspects of the third implementation, operation of both the first actuator and the second actuator causes the linkage system to move and physically engage the external interface of the computing device.

In some aspects of the third implementation, the method further includes, after operating the first actuator, generating data via a sensor unit that is indicative of a position of the first actuator, a position of the external interface of the computing device, a position of the linkage system, or any combination thereof.

In some aspects of the third implementation, determining whether the first physical engagement occurred includes analyzing the data to determine whether the external interface of the computing device was physically engaged by linkage system after the operating of the first actuator.

In some aspects of the third implementation, the method further includes, in response to the data indicating that the first physical engagement occurred, recording the remote engagement event. The method further includes, in response to the data indicating that the first physical engagement did not occur, determining whether a timeout threshold has been satisfied. The method further includes, in response to the timeout threshold not being satisfied, operating the first actuator again to move the linkage system. The method further includes, in response to the timeout threshold being satisfied, recording a remote failure event in the log.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments and are therefore not to be considered as limitations on the scope of the various embodiments or claims.

FIG. 3A is a flowchart of a method for operating the computing system of FIG. 1, according to aspects of the present disclosure.

FIG. 3B is a flowchart of sub-steps of one step of the method of FIG. 3A, according to aspects of the present disclosure.

DETAILED DESCRIPTION

Figure 1:
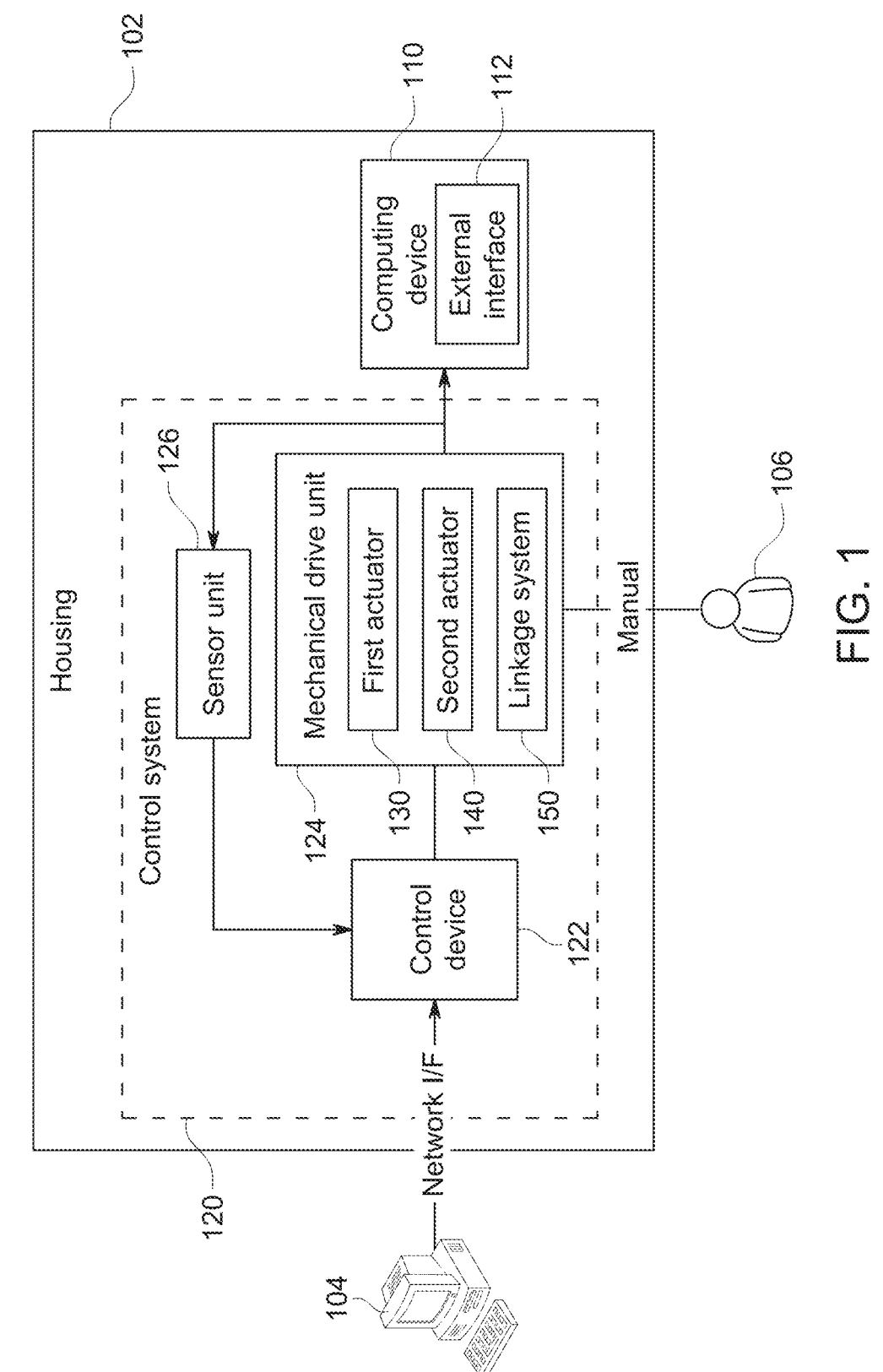
FIG. 1 is a block diagram of a computing system that includes control device for physically engaging with an external interface of a computing device, according to aspects of the present disclosure.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

FIG. 1 is a block diagram of a computing system 100 that can be used for remote server operations. The computing system 100 a housing 102, a computing device 110 positioned at least partially within the housing 102, and a control system 120 positioned at least partially within the housing 102. The computing device 110 acts as the remote server, and the control system 120 can be used to control the computing device 110.

The computing device 110 has an external interface 112 that can be physically engaged by an on-site human being, and generally cannot be remotely engaged through network operations. This external interface 112 can include a button, a switch, a lever, a knob, a dial, or generally any suitable physically engageable interface on the computing device 110. For example, the external interface 112 can include a power button of the computing device 110, which could be used to power on the computing device 110, power off the computing device 110, reset the computing device 110, etc. The external interface 112 could additionally or alternatively include a button used to eject an insertable component of the computing device 110 (e.g., removable storage media). The computing device 110 may be entirely positioned within housing 102, or may only be partially positioned within the housing 102 and have various components that extend out of the housing 102 and/or are accessibly externally from the housing 102.

The control system 120 includes a control device 122, a mechanical drive unit 124, and a sensor unit 126. The control device 122 can include a processing device such as a microcontroller or a baseboard management controller (BMC), and is configured to be communicatively coupled to an external network 104 via any suitable network interface, including wired interfaces (e.g., Ethernet, USB, etc.) and wireless interfaces (e.g., Wi-Fi, Bluetooth, etc.). The control device 122 can receive commands associated with operation of the computing device 110 via the external network. These commands can include specific commands to operate and/or interact with the computing device 110, such as a command to power on the computing device 110, a command to power off the computing device 110, a command to reset the computing device 110, a command to eject an insertable component (e.g., removable storage media) from the computing device 110, and others. The commands may also include more general commands to operate and/or interact with the mechanical drive unit 124 and/or components thereof.

The mechanical drive unit 124 includes a first actuator 130, a second actuator 140, and a linkage system 150 that is mechanically coupled to both the first actuator 130 and the second actuator 140. Both the first actuator 130 and the second actuator 140 are operable to move the linkage system 150 between different positions. When moved to a specific position by the first actuator 130 or the second actuator 140, the linkage system 150 physically engages the external interface 112 of the computing device 110 (e.g., presses a button on the computing device 110).

The first actuator 130 is an electric actuator that is electronically operable by the control device 122 to move the linkage system 150. In general, the first actuator 130 will have an actuating component that contacts and imparts force on the linkage system 150 to move the linkage system 150 between the different positions. The first actuator 130 can be a rotary electric motor, a linear electric motor, an electromechanical actuator (e.g., an electric motor with additional mechanical components to adjust the motor movement as needed), an electrohydraulic actuator (e.g., an electric motor that drives a hydraulic actuator), etc. For example, in some implementations the first actuator 130 includes a stepper motor or a servomotor with a rotating shaft and a cam coupled to the rotating shaft. In another example, in some implementations the first actuator 130 includes a stepper motor or a servomotor with a translatable shaft. The control device 122 can send signals to the first actuator 130 (e.g., digital and/or analog voltages) to operate the first actuator 130.

The second actuator 140 is manually operable by a local user 106 to move the linkage system 150. Similar to the first actuator 130, the second actuator 140 will include an actuating component that imparts force on the linkage system 150 to move the linkage system 150 between different positions. In some implementations, the second actuator 140 is a button that can be pressed by the local user 106. In these implementations, the entirety of the second actuator 140 (or nearly the entirety of the second actuator 140) is the actuating component. In other implementations, the portion of the second actuator 140 that is contacted by the local user 106 is not the actuating component that contacts and imparts force on the linkage system 150. In general, at least a portion of the second actuator 140 will be accessible externally from the housing 102. Thus, the mechanical drive unit 124 is generally considered to be positioned partially within housing 102. However, in some implementations, the mechanical drive unit 124 may be positioned entirely within the housing 102 while still allowing the second actuator 140 to be operated by the local user 106.

The sensor unit 126 includes one or more sensors that are able to generate data indicative of whether the external interface 112 of the computing device 110 has been physically engaged by the linkage system 150. In some implementations, the sensor unit 126 includes one or more sensors that generate data associated with the first actuator 130, a position of the second actuator 140, a position of the linkage system 150, a position of the external interface 112 of the computing device 110, or any combination thereof. This data can be indicative of the physical position of any of these components, the state of any of these components (e.g., whether the external interface has been physically engaged, regardless of its physical position), a history of use of any of these components, and other characteristics. In some implementations, the sensor unit 126 includes an infrared (IR) sensor, a Hall effect sensor, an inductive sensor, a piezoelectric transducer, a position encoder (e.g., a rotary encoder, a linear encoder, etc.), a photodiode array, other suitable sensors, or any combination thereof. In some implementations, the sensor unit 126 can include, for example, a wired connection to the computing device 110 (e.g., USB, Ethernet, etc.) that can be used to determine the state of the computing device 110 (e.g., off, on, booting, re-booting, etc.). The data generated by the sensor unit 126 can be transmitted to the control device 122, which can operate the first actuator 130 and/or perform other functions based on the data.

In some implementations, the data can be used to determine whether a given operation of the first actuator 130 was successful in causing the linkage system 150 to physically engage the external interface 112. For example, the data could include data indicative of a position of the linkage system 150 to determine whether the linkage system 150 moved in response to operation of the first actuator 130, data indicative of a position of the external interface 112 (e.g., whether an external button of the computing device 110 is currently pressed down or not) to determine whether the external interface 112 was physically engaged in response to operation of the first actuator 130, or both. If the control device 122 determines that the external interface 112 was not physically engaged in response to operation of the first actuator 130, the control device 122 can again operate the first actuator 130 to try and cause the linkage system 150 to physically engage the external interface 112.

In some implementations, because the control device 122 does not actively control the second actuator 140 and would not otherwise know when the second actuator 140 has been operated by the local user 106 (apart from determining that the linkage system 150 has moved and/or the external interface 112 has been physically engaged without having operated the first actuator 130), the data can be used to indicate to the control device 122 when the second actuator 140 has been operated by the local user 106. For example, the sensor unit 126 may include a sensors that generates data indicative of the position of the second actuator 140 (e.g., the position of the button to be pressed by the local user 106). When the local user 106 operates the second actuator 140, the change in the position of the second actuator 140 is communicated to the control device 122.

Data associated with operation of the computing system 100 can be stored in a log of the computing system 100. For example, the control device 122 may include a log (stored in internal memory thereof) in which different events can be recorded. These events can include a remote engagement event in response to detecting that the external interface 112 was physically engaged in response to operation of the first actuator 130, a remote failure event in response to detecting that the external interface 112 was not physically engaged in response to operation of the first actuator 130, a local engagement event in response to detecting that the external interface 112 was physically engaged in response to the local user 106 manually operating the second actuator 140, and others.

Figure 2A:
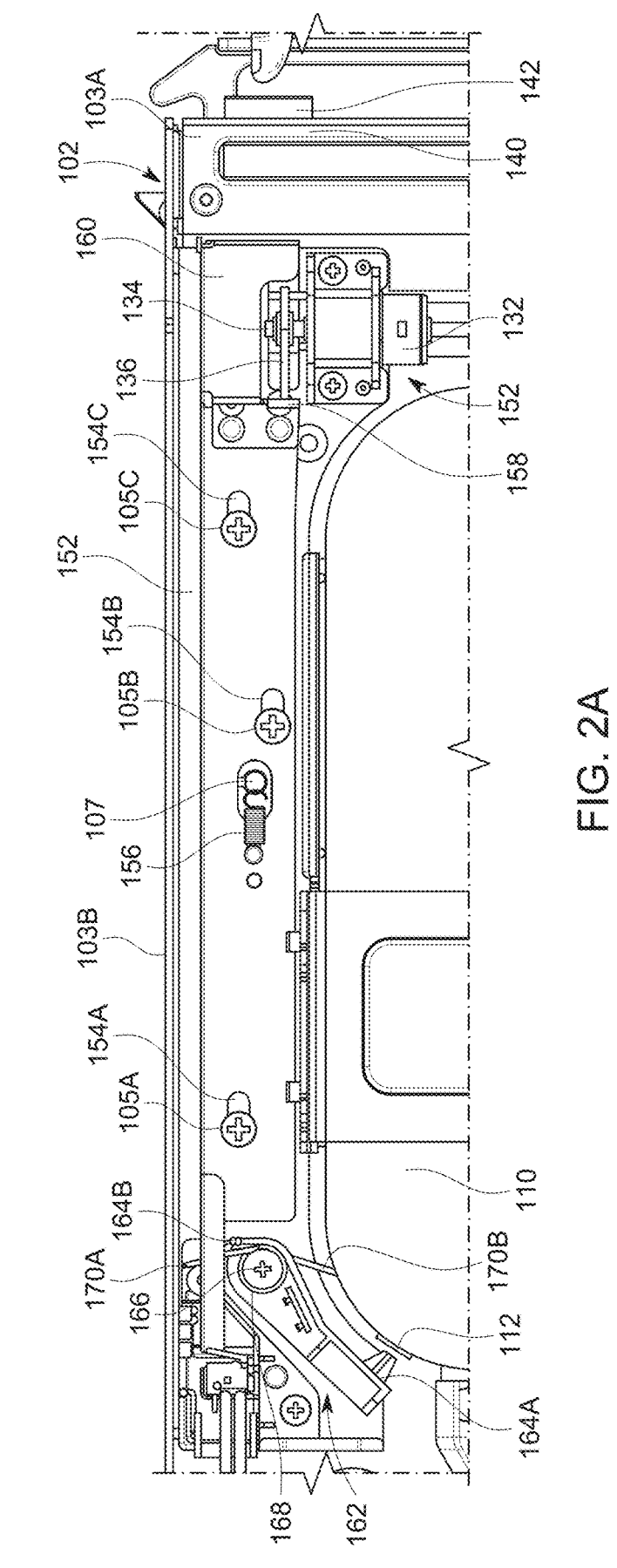
FIG. 2A is a top view of a mechanical drive unit of the computing system of FIG. 1 in a first position, according to aspects of the present disclosure.
Figure 2B:
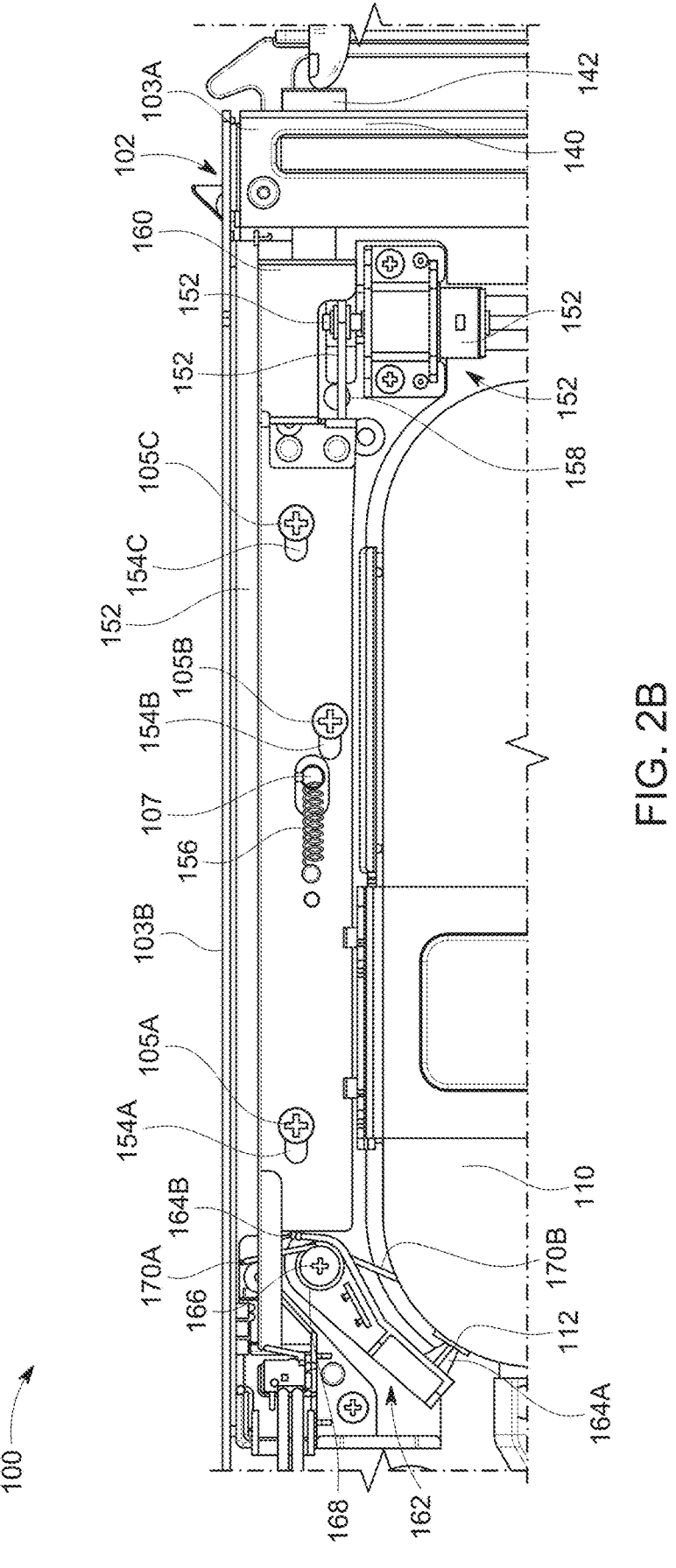
FIG. 2B is a top view of the mechanical drive unit in a second position, according to aspects of the present disclosure.

FIGS. 2A and 2B show overhead views of the computing system 100, including the mechanical drive unit 124. As shown, the linkage system 150 includes a bracket 152 and a rotatable arm 162 coupled to the bracket 152. The bracket 152 is mounted between a front wall 103A of the housing 102 and the rotatable arm 162, and extends along a side wall 103B of the housing 102, generally parallel to the side of the computing device 110. In the illustrated implementation, the external interface 112 is located at the back of the computing device 110. However, the bracket 152 and the rotatable arm 162 can generally be located anywhere relative to the housing 102 and the computing device 110 in order to engage the external interface 112.

The bracket 152 includes a series of slots 154A, 154B, and 154C that are defined therein. When the bracket 152 is mounted in the housing 102, mounting posts 105A, 105B, and 105C extend through the slots 154A-154C. Because each of slots 154A-154C extend linearly along the length of the bracket 152, the bracket 152 is able to move linearly along the side of the computing device 110, toward the rotatable arm 162. The length of the slots 154A-154C defines the maximum linear distance the bracket 152 is able to move. The bracket 152 also includes a spring 156 coupled to a stopper 107 of the housing 102. As the bracket 152 moves toward the rotatable arm 162, the spring 156 stretches, which thus biases the bracket 152 away from the rotatable arm 162. In other implementations however, the bracket 152 may be biased toward the rotatable arm 162, or not biased at all.

The rotatable arm 162 is positioned adjacent to the end of the bracket 152 that is nearest the external interface 112 of the computing device 110. A distal end 164A of the rotatable arm 162 is positioned in close proximity with the external interface 112, while a proximal end 164B is positioned in close proximity to the end of the bracket 152. In the illustrated implementation, the rotatable arm 162 is not directly coupled to the bracket 152 itself. Instead, the rotatable arm 162 is rotationally mounted within the housing 102 on a mounting post 166 (e.g., a screw, a rod, etc.). When the bracket 152 moves linearly toward the rotatable arm 162, the bracket 152 presses against the proximal end 164B, causing the distal end 164A to rotate toward and physically engage the external interface 112. In other implementations however, the rotatable arm 162 may be directly coupled to the bracket 152, or coupled to both the bracket 152 and another component within the housing 102, so long as the movement of the bracket 152 towards the rotatable arm 162 causes the distal end 164A to rotate toward and engage the external interface 112.

In the illustrated implementation, the rotatable arm 162 includes a torsion spring 168 through which the mounting post 166 extends. The torsion spring 168 includes a first leg 170A that is positioned in close proximity to (and in some cases contacting) the bracket 152, and a second leg 170B that is positioned in close proximity to the computing device 110. When the bracket 152 moves linearly and presses against the proximal end 164B, the bracket 152 also presses against the first leg 170A of the torsion spring 168. Because the second leg 170B is in close proximity to (and in some cases is already contacting) the computing device 110, the torsion spring is compressed as the distal end 164A rotates toward the external interface 112. This compression of the torsion spring 168 biases the rotatable arm 162 away from the external interface 112. In other implementations however, the rotatable arm 162 could be biased away from the external interface 112, toward the external interface 112, or not biased at all.

The linkage system 150 can generally move between at least a first position and a second position. When the linkage system 150 moves between the first position and the second position, the bracket 152 moves linearly and causes the rotatable arm 162 to rotate relative to the bracket 152 and physically engage the external interface 112. The first actuator 130 and the second actuator 140 can impart force on the linkage system 150 to move the linkage system 150 from the first position to the second position, which in turn causes the linkage system 150 to physically engage the external interface 112

The linkage system 150 is in its first position in FIG. 2A, and thus the bracket 152 and the rotatable arm 162 are in their respective first positions. The bracket 152 is positioned closer to the front wall 103A of the housing 102, and closer to the front side of the computing device 110 than the back side (and the external interface 112). The rotatable arm 162 is rotated such that the distal end 164A of the rotatable arm 162 is spaced apart from the external interface 112.

In the illustrated implementation, the first actuator 130 includes an electric motor 132 with a rotatable shaft 134 and a cam 136 coupled to the rotatable shaft 134. The electric motor 132 is positioned within the housing such that the cam 136 is positioned in close proximity to a face 158 of the bracket. When the electric motor 132 is operated by the control device 122, the rotatable shaft 134 rotates and causes the cam 136 to rotate against the face 158. Generally, the cam 136 will have an eccentric shape and the face 158 will be generally flat, such that the rotation of the cam 136 against the face 158 imparts a force on the bracket 152. This imparted force causes the bracket 152 to move linearly along the slots 154A-154C toward the rotatable arm 162, to its second position.

In other implementations, the first actuator 130 can have a different form. For example, the first actuator 130 could include an electric motor with a translatable shaft. When this electric motor is operated by the control device 122, the translatable shaft extends toward and presses against the face 158 to impart a force on the bracket 152. This imparted force causes the bracket 152 to move linearly along the slots 154A-154C toward the rotatable arm 162, to its second position.

In the illustrated implementation, the second actuator 140 includes a button 142 with a touch surface that protrudes from the front wall 103A of the housing 102, and a shaft that extends through the front wall 103A toward the bracket 152. The shaft is positioned in close proximity to a front portion 160 of the bracket 152. When the button 142 is pressed by the local user, the shaft presses against the front portion 160 and imparts a force on the bracket 152. This imparted force causes the bracket 152 to move linearly along the slots 154A-154C toward the rotatable arm 162, to its second position.

The linkage system 150 is in its second position in FIG. 2B, after the bracket 152 has been moved to its second position by the first actuator 130 and/or the second actuator 140, and caused the rotatable arm 162 to move to its second position. As shown, the bracket 152 has moved linearly toward the rotatable arm 162 and pressed against the proximal end 164B of the rotatable arm 162, which causes the rotatable arm 162 to move to its second position. In moving to the second position, the distal end 164A rotates toward and physically engages the external interface 112 of the computing device 110. The external interface 112 is a button in the illustrated implementation, and thus the rotatable arm 162 physically engaging the external interface 112 includes the distal end 164A pushing the button. In other implementations, the distal end 164A of the rotatable arm 162 (and/or other portions of the rotatable arm 162) could interact differently with other forms of the external interface 112 to physically engage the external interface 112. For example, the distal end 164A of the rotatable arm 162 could be used to flip a switch or a lever. The rotatable arm 162 could also be designed to rotate a knob or dial.

Thus, in response to the first actuator 130 and/or the second actuator 140 being operated to impart force on the bracket 152, the bracket 152 moves linearly toward the rotatable arm 162, and causes the distal end 164A of the rotatable arm 162 to rotate toward and physically engage the external interface 112 of the computing device 110. The first actuator 130 and the second actuator 140 are thus both operable to move the linkage system 150 from the first position to the second position to physically engage the external interface 112 of the computing device 110.

As discussed, in the illustrated implementation, both the bracket 152 and the rotatable arm 162 are biased toward their respective first positions, such that the linkage system 150 as a whole is biased toward its first position. The bracket 152 is biased by the spring 156 being stretched when the bracket 152 is moved to its second position by the first actuator 130 and/or the second actuator 140. The rotatable arm 162 is biased by the torsion spring 168 being compressed when the rotatable arm 162 is moved to its second position by the bracket 152. When the force that is being imparted on the bracket 152 to move it to its second position is removed, both the bracket 152 and the rotatable arm 162 will automatically move back to their first positions, such that the linkage system 150 as a whole automatically moves back to its first position, causing physical disengagement of the external interface.

For example, if the first actuator 130 includes the electric motor 132 with the rotatable shaft 134 and the cam 136, the linkage system 150 will move back to the first position once the cam 136 is rotated far enough such that the eccentric shape of the cam 136 no longer imparts a force on the face 158 of the bracket 152. In another example, if the first actuator 130 includes an electric motor with the translatable shaft, the linkage system 150 will move back to the first position once the translatable shaft retracts and no longer imparts a force on the face 158 of the bracket 152. In a further example, if the second actuator 140 includes the button 142, the linkage system 150 will move back to the first position once the shaft of the button 142 no longer imparts a force on the face 158 of the bracket 152, which is generally when the local user stops pressing the button 142.

FIG. 3A illustrates a flowchart of a method 300 for operating a computing system (such as the computing system 100) that includes a computing device (such as the computing device 110), a linkage system (such as the linkage system 150) that is configured to physically engage with an external interface of the computing device (such as the external interface 112), a control device (such as the control device 122), a first actuator operable by the control device (such as the first actuator 130), and a second actuator operable by a local user (such as the second actuator 140).

Step 310 includes surveilling from input from a remote network (such as the external network 104) and/or for physical engagement of the external interface by the linkage system of the computing system that is caused by manual operation of the second actuator. In some implementations, step 310 is performed by the control device, which can be a separate processing device from the computing device 110, such as a microcontroller or a BMC.

If input from the remote network is detected and/or received at step 310, method 300 proceeds to step 320A. Step 320A includes operating the first actuator—which is coupled to the linkage system—in response to receiving the input from the external network. The first actuator can be any suitable actuator, such as a rotary electric motor or a linear electric motor. The remote input can generally include any input or command that may require the first actuator to be operated, and may include a command to power on the computing device 110, to power off the computing device 110, to reset the computing device 110, to eject an insertable component (e.g., removable storage media) from the computing device 110, and other commands. In some implementations, the first actuator is operated by the control device of the computing system. The control device can be a separate processing device from the computing device 110, such as a microcontroller or a BMC.

From step 320A, method 300 proceeds to step 330. Step 330 includes recording a remote engagement event in response to detecting a first physical engagement of the external interface by the linkage system after operating the first actuator. The remote engagement event can be recorded in a log of the computing system, such as a log of the control device. Method 300 can then return to step 310 after the remote engagement event is recorded.

If a second physical engagement of the external interface system in response to manual operation of the second actuator is detected at step 310, method 300 proceeds to step 320B. Step 320B includes recording a local engagement event in the log of the computing device in response to detecting the physical engagement of the external interface by the linkage system that is caused by manual operation of the second actuator. The manual operation of the second actuator will generally have been performed by a local user (such as the local user 106). The second actuator can be any suitable actuator, and is generally a non-electronically controlled actuator such as a button that is pressed by the local user.

In some implementations, step 320B includes analyzing data generated by a sensor unit (such as the sensor unit 126) to determine whether the second physical engagement occurred. The data may be indicative of the position of the first actuator, the position of the second actuator, the position of the linkage system, the position of the external interface, or any combination thereof. If the data indicates that the second physical engagement occurred, the local engagement event can be recorded.

In some implementations, the local engagement event is recorded only in response to detecting that the external interface has been physically engaged by the linkage system subsequent to detecting manual operation of the second actuator. In other implementations, the local engagement event is recorded only in response to detecting that the external interface has been physically engaged by the linkage system without the control device having operated the first actuator. In further implementations, the local engagement event is recorded only in response to detecting that the external interface has been physically engaged by the linkage system both (i) subsequent to detecting manual operation of the second actuator and (ii) without the control device having operated the first actuator. In any of these implementations, method 300 can return to step 310 after the local engagement event is recorded.

In some implementations, step 330 includes a number of sub-steps. FIG. 3B shows a flowchart of the sub-steps of step 330. Sub-step 332 (which is performed after the first actuator is operated in step 320A) includes generating data indicative of the position of the first actuator, the position of the second actuator, the position of the linkage system, the position of the external interface, or any combination thereof. This data can be generated using, for example, the sensor unit, and can be transmitted to the control device. Sub-step 334 includes analyzing the data to determine whether the first physical engagement of the external interface by the linkage system following operation of the first actuator occurred. The control device performs the analysis of the data to determine the state and/or position of any of the components.

Step 330 can then proceed to different sub-steps based on the analysis of the data and the determination of whether the first physical engagement occurred in sub-step 334. Sub-step 336 includes recording the remote engagement event in response to determining that the first physical engagement. Similar to the above description of step 330, the remote engagement event can be recorded in a log of the computing system, such as a log of the control device. After the remote engagement event is recorded, method 300 returns to step 310.

Sub-step 338 includes determining whether a timeout threshold has been satisfied in response to determining that the first physical engagement did not occur. The timeout threshold indicates a period of time within which it is acceptable to operate the first actuator again to try and cause the external interface to be physically engaged by the linkage system, instead of reporting an error. The timeout threshold can be implemented by the control device, which may keep track of the time elapsed since the input was received from the external network, since the first actuator was operated, since the linkage system was moved by the first actuator, or any combination thereof. Any suitable timeout threshold can be used, such as 500 milliseconds, 1 second, 5 seconds, 10 seconds, 20 seconds, 30 seconds, 1 minute, or any other suitable time or range of time.

Step 330 can then proceed to different sub-steps based on the determination of whether the timeout threshold has been satisfied. Sub-step 340A includes, in response to the timeout threshold not being satisfied, again operating the first actuator using the control device. After the first actuator is operated again, method 300 returns to sub-step 332 of step 330. Sub-step 340B includes, in response to the timeout threshold being satisfied, recording a remote failure event in a log of the computing system, such as a log of the control device. After the remote failure event is recorded, method 300 returns to step 310.

Although the disclosed embodiments have illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described been above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above-described embodiments. Rather, the scope of the disclosure should be defined in accordance with the following claims and their equivalents.

What is claimed is:

1. A control system for a computing device, the control system comprising:
   a control device configured to be communicatively coupled to an external network;
   a first actuator coupled to the control device, the first actuator being electronically operable by the control device in response to commands received by the control device via the external network;
   a second actuator manually operable by a local user; and
   a linkage system coupled to the first actuator and the second actuator,
   wherein both the first actuator and the second actuator are operable to move the linkage system from a first position to a second position to physically engage an external interface of the computing device.

2. The control system of claim 1, wherein the linkage system includes a bracket configured to move linearly, and a rotatable arm positioned adjacent to the bracket and configured to rotate relative to the bracket.

3. The control system of claim 1, further comprising a sensor unit communicatively coupled to the control device, the sensor unit being configured to generate data associated with a position of the first actuator, a position of the second actuator, a position of the linkage system, a position of the external interface of the computing device, or any combination thereof, the sensor unit being further configured to transmit the data to the control device.

4. The control system of claim 1, wherein the control device is a microcontroller.

5. The control system of claim 1, wherein the first actuator is an electric motor.

6. The control system of claim 1, wherein the second actuator is a button.

7. The control system of claim 2, wherein the first actuator and the second actuator are operable to impart force on the bracket such that the bracket moves linearly toward the rotatable arm, the linear movement of the bracket causing the rotatable arm to rotate toward and physically engage the external interface of the computing device.

8. The control system of claim 5, wherein the electric motor is a stepper motor or a servomotor.

9. The control system of claim 7, wherein the external interface of the computing device is a button, and wherein the rotatable arm is configured to press the button in response to the first actuator or the second actuator moving the linkage system from the first position to the second position.

10. The control system of claim 7, wherein the first actuator is an electric motor having a rotatable shaft coupled to a cam, and wherein in response to the control device operating the motor, the cam rotates against the bracket causing the bracket to move linearly, the linear movement of the bracket causing the rotatable arm to rotate.

11. The control system of claim 7, wherein the second actuator is a button, and wherein in response to the local user pressing the button, the button presses against the bracket to cause the bracket to move linearly, the linear movement of the bracket causing the rotatable arm to rotate.

12. The control system of claim 7, wherein the linkage system is biased toward the first position, and wherein, in response to the first actuator or the second actuator no longer imparting force on the bracket, the bracket moves linearly away from the rotatable arm, the linear movement of the bracket causing (i) rotation of the rotatable arm away from the external interface and (ii) physical disengagement of the external interface.

13. A computing system comprising:
a housing;
a computing device positioned within the housing and having an external interface;
a control device positioned within the housing and configured to be communicatively coupled to an external network;
a first actuator positioned within the housing and coupled to the control device, the first actuator being electronically operable by the control device in response to commands received by the control device via the external network;
a second actuator positioned partially within the housing and accessible externally from the housing, the second actuator being manually operable by a local user; and
a linkage system positioned within the housing and coupled to the first actuator and the second actuator,
wherein both the first actuator and the second actuator are operable to move the linkage system from a first position to a second position to physically engage the external interface.

14. The computing system of claim 13, wherein the external interface of the computing device includes a button, a lever, a switch, a dial, a knob, or any combination of thereof.

15. The computing system of claim 13, wherein physically engaging the external interface of the computing device powers on the computing device, powers off the computing device, resets the computing device, or ejects an insertable component from the computing device.

* * * * *